(12) United States Patent
Patel et al.

(10) Patent No.: US 7,044,732 B2
(45) Date of Patent: May 16, 2006

(54) ROLLING PROCESS COVER

(75) Inventors: Pradyumna V. Patel, Southlake, TX (US); Jesse R. Brown, Garland, TX (US)

(73) Assignee: V-Automation Inc., Southlake, TX (US)

( * ) Notice: Subject to any disclaimer, the term of this patent is extended or adjusted under 35 U.S.C. 154(b) by 0 days.

(21) Appl. No.: 10/756,594

(22) Filed: Jan. 13, 2004

(65) Prior Publication Data
US 2004/0161721 A1   Aug. 19, 2004

Related U.S. Application Data

(60) Provisional application No. 60/439,721, filed on Jan. 13, 2003.

(51) Int. Cl.
*F27D 1/18* (2006.01)

(52) U.S. Cl. .................. 432/250; 432/56; 160/238; 160/243

(58) Field of Classification Search .................. 432/56, 432/57, 250; 16/87 R, 97, 98; 160/238, 160/243; 110/173 R; 118/715, 725
See application file for complete search history.

(56) References Cited

U.S. PATENT DOCUMENTS

| 2,323,828 | A | * | 7/1943 | Mayer | 432/56 |
| 5,655,585 | A | * | 8/1997 | Fry | 160/10 |
| 6,612,357 | B1 | * | 9/2003 | Beringer et al. | 160/10 |

* cited by examiner

*Primary Examiner*—Gregory Wilson
(74) *Attorney, Agent, or Firm*—Munsch Hardt Kopf & Harr P.C.

(57) ABSTRACT

A cover for the opening of a process tube of a furnace used in semiconductor manufacturing is comprised of a substantially continuous sheet of metal so that it may be rolled opened and closed while being against the opening of the process tube by a guide frame. The roller on which the cover is rolled is driven by a bidirectional DC motor. The process tube cover can be operated by a computer or controller that operates the furnace.

7 Claims, 4 Drawing Sheets

ROLLING PROCESS COVER

This application claims priority to U.S. provisional application No. 60/439,721 filed Jan. 13, 2003.

BACKGROUND OF THE INVENTION

The invention pertains generally to process tubes used in semiconductor manufacturing.

A process tube is a device that is used in the manufacturing of semiconductor wafers. These tubes are inside furnaces that reach temperatures of up to 1200° C. Whenever the wafers are taken out of the tubes, the tubes are considered to be at idle. An exhaust system, known as a Scavenger, is attached to the furnace to remove the gasses used in the processing of the wafers. When the process tubes are at idle, ambient air is sucked into the openings of the process tubes and tends to overload the exhaust system. Particles and contaminants are also able to flow into the process tubes, which can lead to the contamination of the wafers during processing. There is also a large quantity of heat radiating from the process tubes due to the high temperatures generated by the furnaces. This can be an unsafe condition for the operator, adversely raises the room temperature, and increase the time it takes for the wafer boat to cool down. It also reduces the additional build-up of an oxide layer on the semiconductor wafer.

It is not uncommon for operators to use a make-shift cover to temporary close the process tube by manually lifting and placing a rigid sheet of metal across the opening to close it, and then removing it for insertion of wafers. One problem with this approach is that the cover can be dropped or knocked against the wafers, potentially damaging many thousands of dollars worth of wafers.

BRIEF SUMMARY OF THE INVENTION

One reason for process tubes not having an installed cover is that there is often not enough room to accommodate them. Covers also get in the way of the manufacturing process.

The invention pertains to covers suitable for covering a process tube during idle that overcomes one or more of the problems pointed out above. A cover according to the teachings of the preferred embodiment of the invention is particularly suitable for use where there is limited space or clearance for a cover, such as process tubes of furnaces used in semiconductor fabrication. It is also suitable for automated operation.

According to a preferred embodiment a cover is comprised of a flexible, substantially coutinuous sheet of metal that is rolled onto a roller in order to move it to an open position, and a frame for receiving opposing edges of the metal sheet as it is being unrolled, the frame restraining the bendable metal sheet so that may extend across an opening to be closed.

Thus, the invention, in its preferred embodiment, minimizes introduction of the ambient air into the process tube, as well as reduce the destructive particles that can cause contamination from entering the process tube, during idle. It also improves operator and product safety by minimizing the radiant heat from the process tube, reduce additional build-up of an oxide layer on the semiconductor wafer.

According to another aspect of the preferred embodiment of the invention, another object of this invention is to permit optional easy removal and re-installation. This may be done by pinned mounting brackets that allow the service engineer to re-install the process tube cover without realignment or recalibration requirements.

According to another aspect of the preferred embodiment of the invention, operation of a process tube cover may be integrated with a process tube computer to automate the process tube cover operation with the process. In case of an emergency, the process tube cover may be opened and/or closed manually.

DETAILED DESCRIPTION OF A PREFERRED EMBODIMENT

Figure 1:
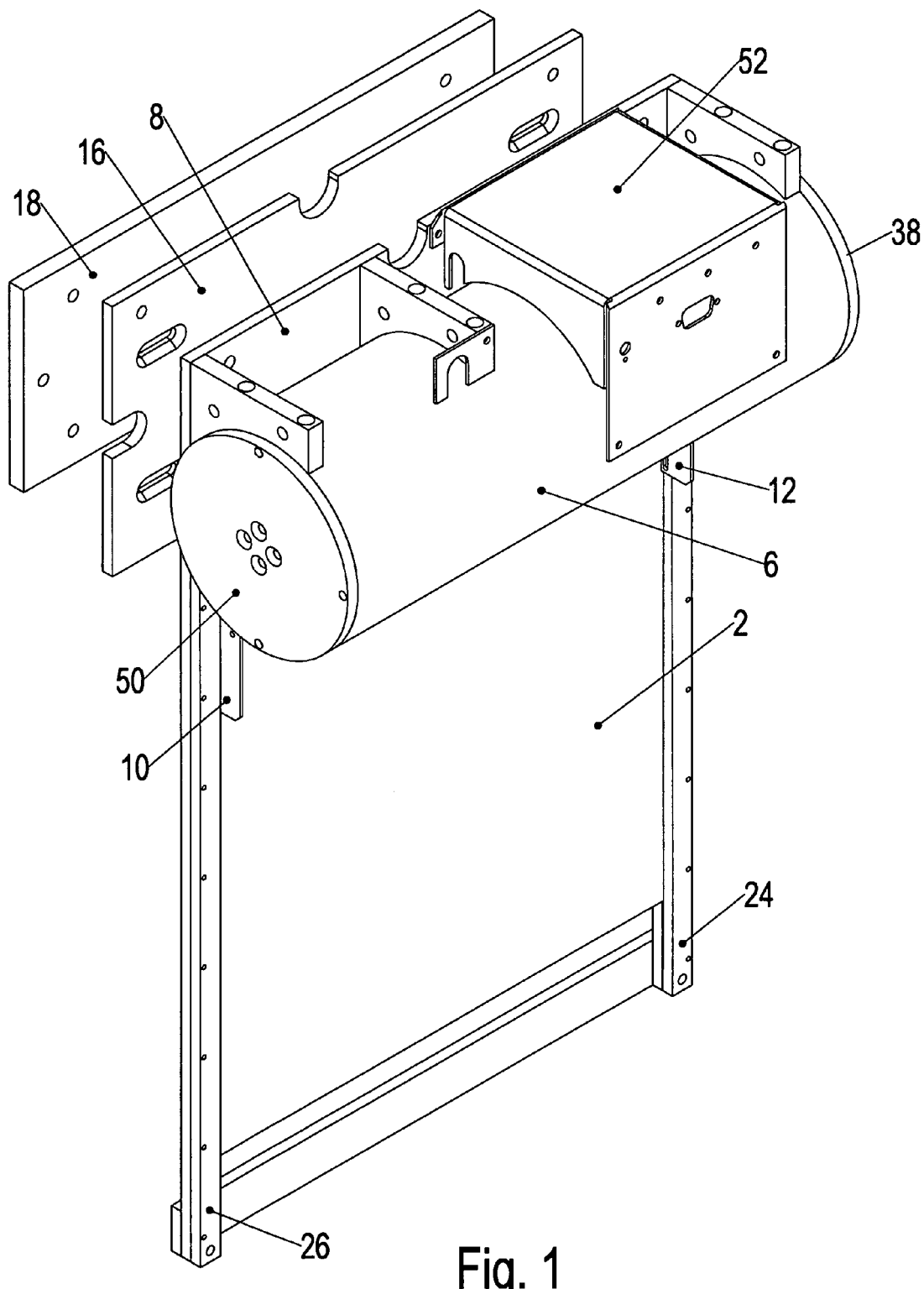
FIG. 1 is an assembly view of the rolling process tube cover
Figure 2:
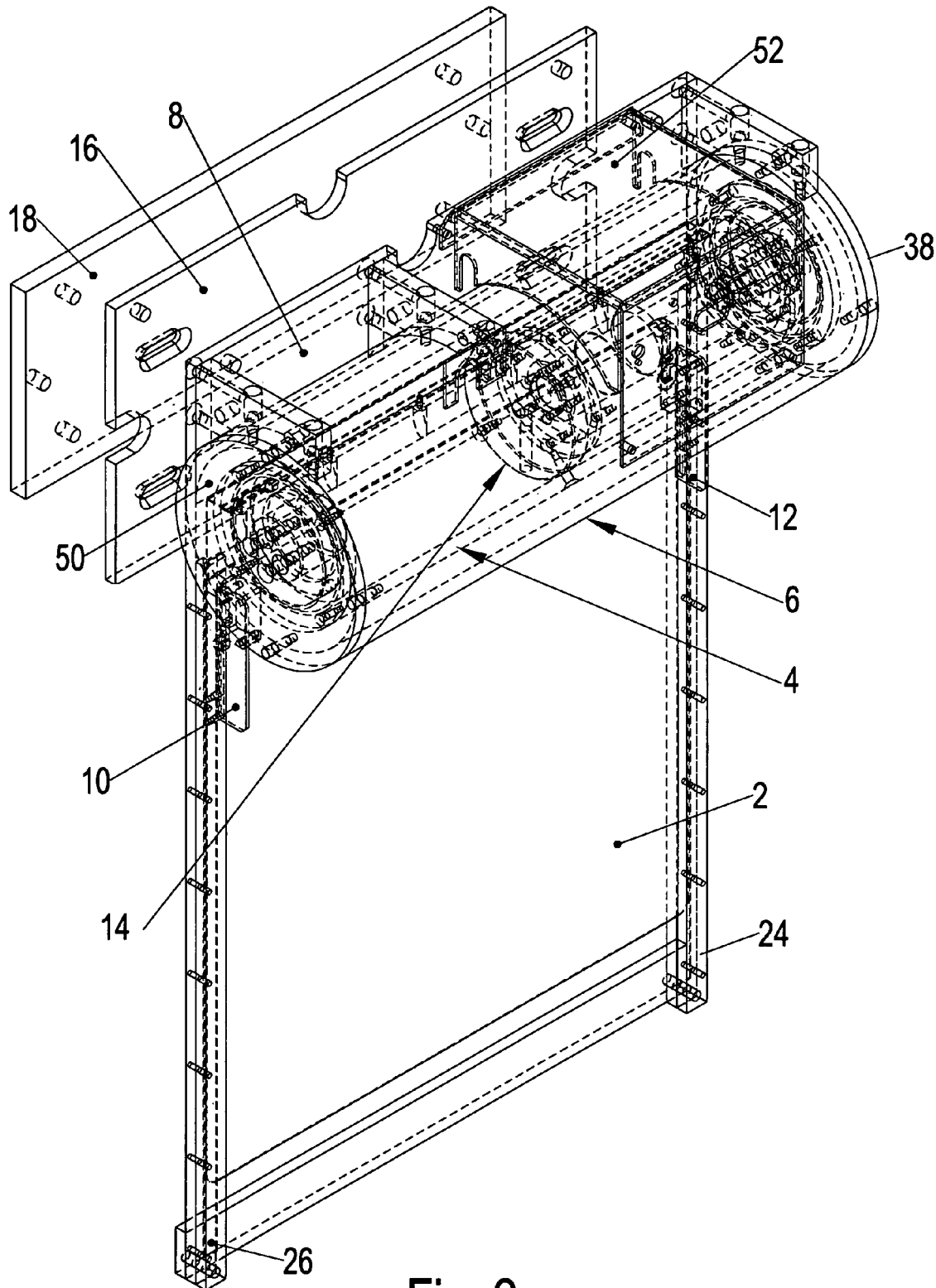
FIG. 2 is an assembly view of the rolling process tube cover of FIG. 1 with internal components indicated in phantom by broken lines.
Figure 3:
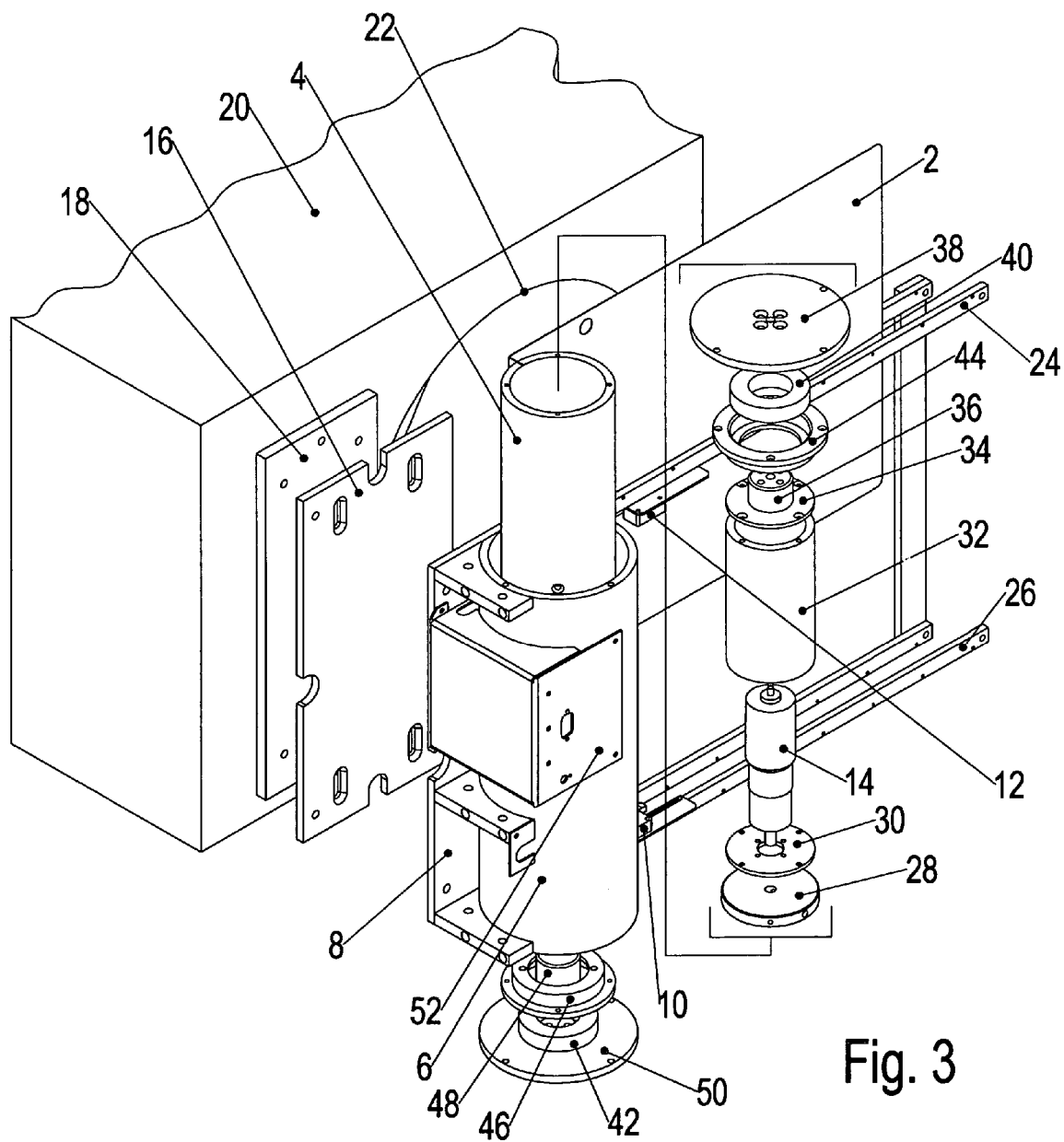
FIG. 3 is an exploded view of the rolling process tube cover of FIG. 1.
Figure 4:
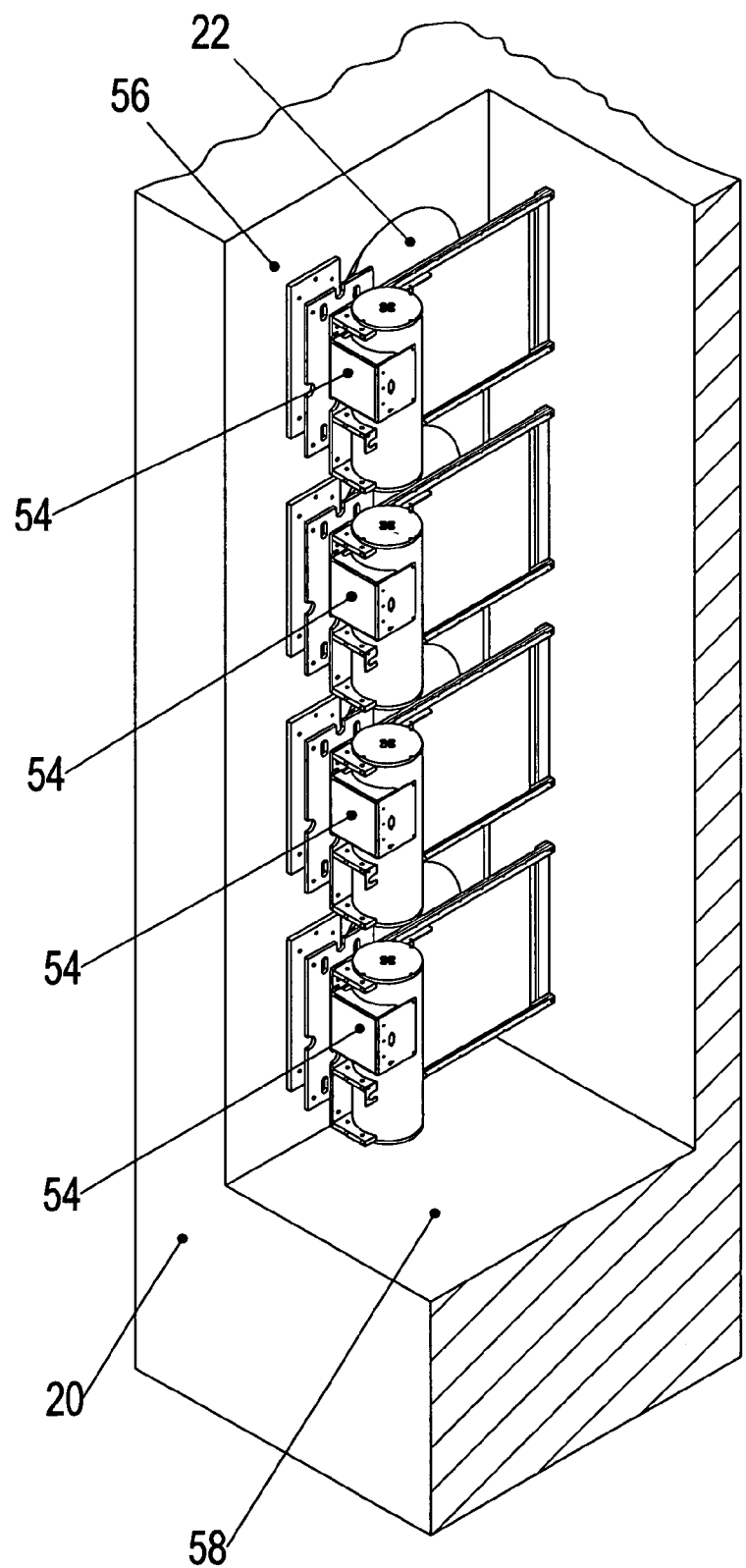
FIG. 4 is a view of the rolling process tube covers installed on a furnace

A preferred embodiment of a process tube cover is shown in perspective view in FIG. 1. FIG. 2 shows it assembled, with its internal components indicated in phantom by broken lines. FIG. 3 is an exploded view of the process tube cover. FIG. 4 is an example of how it is may be installed on process tubes of a furnace.

Furnace cover 2 is connected to inner cylinder 4, which acts a roller. The cover 2 is housed in between outer housing 6 and the inner cylinder 4. A slot between the outer housing 6 and base plate 8 allows the furnace cover 2 to roll out of the embodiment. Sensors 10 and 12 are located on the base plate 8 and allow a computer to monitor the open or closed status of the embodiment. Bi-directional motor 14 is attached to the inner cylinder 4 and controls the opening or closing of the cover 2. Mounting mechanism 16 is attached to mounting plate 18 and allows the embodiment to be easily mounted on furnace 20 to close off the opening of the process tube 22. The slides 24 and 26 guide the furnace cover 2 in and out of the embodiment.

Bi-directional motor 14 is attached by its shaft to the drive disc 28, which in turn is attached to the inner cylinder 4. The Bi-directional motor 14 is face-mounted to motor mounting plate 30, which is mounted to motor cylinder 32. The motor cylinder 32 is connected to connection plate 34, which is connected to motor bearing shaft 36, which in turn is connected to upper end plate 38. Bearings 40 and 42 are installed in bearing housings 44 and 46, which cap each end of inner cylinder 4. The bearing shaft 48 is connected to lower end plate 50 and goes through bearing 42. The end plates 38 and 50 are attached to the outer housing 6.

The illustrated embodiment is connected to a process tube computer or controller through control panel 52. The motor 14, which controls the movement of the furnace cover 2, is located internally in the inner cylinder 4 in order to reduce the overall dimensions of the process tube cover.

An example of an installation of process tube covers on a furnace is illustrated by FIG. 4. Process tube assemblies 54 are mounted on scavenger plate 56 at load station 58 of a typical furnace 20 of a semiconductor manufacturing operation.

In a preferred embodiment, the cover 2 is made from continuous sheet stainless steel, anodized aluminum or similar material. It is preferably a continuous sheet of spring-tempered Type 301 stainless spring steel meeting ASTM A666 specifications with a Rockwell hardness of C40-45 or equivalent. The cover need not be comprised of multiple, articulated segments. Rather, the material and thickness of the sheet forming the furnace cover 2, and the diameter of the inner cylinder 4 is chosen to keep the critical yield stress higher than approximately 70 Ksi to prevent kinking or bending, but otherwise permit the sheet of material to be wound. The inner cylinder 4, slides 24 and 26, base plate 8, and outer housing 6 are made of 6061-T6 aluminum or equivalent. The outer housing 6, inner cylinder 4, base plate 8, and slides 24 and 26 are preferably coated or impregnated with lubricating material like Teflon®, Tuf-fram® (a Teflon® impregnated hard anodic material) or similar coating. The lubricant reduces the number of particles caused by rubbing of the metal cover against various surfaces. Anodized aluminum and stainless steel particles are neutral and have low electrical conductivity. Thus, to the extent that operation of the cover creates particles, the particles tend not to be attracted to charged surfaces and will tend not to create short circuits on the wafers.

Thus, to summarize the illustrated example, the cover assembly covers the opening of a process tube of a furnace. It is designed to fit near the opening of the process tube. All of the exposed parts of the embodiment are stainless steel, hard-anodized aluminum or similar material. The cover is capable of being rolled open and closed while remaining adjacent the opening of the process tube. Therefore, it occupies less space as compared to other types of covers. It is designed to fit on any make and model of a process furnace. The cover is rolled between an outer surface of an inner roller and an inner surface of an outer housing. The cover is attached to the inner roller. The inner roller is driven by a bi-directional DC motor. The inside surface of the outer housing is preferably coated with a lubricant, such as Teflon® or a Teflon®-like material in order to reduce friction between the outer housing and the cover and reduce loose particles. Sensors will verify the open and closed status of the process tube cover. All of the components of the process tube cover are able to withstand up to the process tube temperature of 1200° C. The process tube cover can be operated by a controller or computer that operates the process tube or furnace. In the case of an emergency, it can be operated manually. Contacting surfaces of the guides for the cover as it is unrolled and base plate will be coated with a lubricant, such as Teflon® or a Teflon®-like material in order to reduce friction and eliminate loose particles.

What is claimed is:

1. A furnace for heating semiconductor wafers, the furnace having at least one process tube with an opening for inserting wafers, and a cover assembly mounted to selectively open and close the process tube, the cover assembly being comprised of a frame having two, substantially parallel guides extending across the opening; a flexible continuous sheet of metal wound on the roller, the sheet of metal capable of being wound on to, and unwound from, the roller without kinking or permanently bending; the roller operable to rotate and thereby push the metal sheet into the guides as the roller rotates and unwinds the metal sheet, the guides restraining opposite edges of the metal sheet such that the unwound portion of the metal sheet remains substantially planar.

2. The furnace of claim 1, wherein the cover assembly further comprises a motor assembly disposed inside of the roller and operable to rotate the roller.

3. The furnace of claim 1, wherein the sheet is comprised of stainless steel or anodized aluminum.

4. The furnace of claim 1, wherein the sheet is comprised of spring-tempered Type 301 stainless spring steel meeting ASTM A666 specifications with a Rockwell hardness of C40-45.

5. The furnace of claim 1, wherein the guides include surfaces for contacting the metal sheet as it is being unwound, the contacting surfaces being lubricated.

6. The furnace of claim 1, wherein the guides are comprised of lubricant-impregnated, hard anodized aluminum.

7. The furnace of claim 1, further comprising a process controller in communication with a control panel for operating the cover assembly.

* * * * *